United States Patent
Harrison

(10) Patent No.: US 10,403,595 B1
(45) Date of Patent: Sep. 3, 2019

(54) WIRESAW REMOVAL OF MICROELECTRONICS FROM PRINTED CIRCUIT BOARD

(71) Applicant: Joel T. Harrison, Henrico, VA (US)

(72) Inventor: Joel T. Harrison, Henrico, VA (US)

(73) Assignee: United States of America, as represented by the Secretary of the Navy, Arlington, VA (US)

(*) Notice: Subject to any disclaimer, the term of this patent is extended or adjusted under 35 U.S.C. 154(b) by 76 days.

(21) Appl. No.: 15/616,200

(22) Filed: Jun. 7, 2017

(51) Int. Cl.
| H05K 13/00 | (2006.01) |
| H01L 23/00 | (2006.01) |
| H05K 13/04 | (2006.01) |

(52) U.S. Cl.
CPC .......... *H01L 24/799* (2013.01); *H01L 24/98* (2013.01); *H01L 2224/7999* (2013.01); *H01L 2224/98* (2013.01)

(58) Field of Classification Search
CPC ........ B23K 1/018; B23K 28/00; B23P 19/00; H05K 13/0486; Y10T 29/53274; Y10T 29/53283; H01L 24/799; H01L 24/98; H01L 2224/7999; H01L 2224/98
USPC ..................................... 29/762, 426.1, 426.4
See application file for complete search history.

(56) References Cited

U.S. PATENT DOCUMENTS

| 3,229,355 A * | 1/1966 | Hluszko ................... G11B 5/10 |
| | | 29/424 |
| 4,110,902 A * | 9/1978 | Tamura .................. G11B 5/193 |
| | | 29/603.16 |
| 5,131,137 A * | 7/1992 | Morrill, Jr. ........... H01G 9/0003 |
| | | 29/412 |
| 5,203,076 A | 4/1993 | Banerji et al. .................. 29/840 |
| 5,875,770 A * | 3/1999 | Fukunaga ............. B23D 59/001 |
| | | 125/16.02 |
| 6,024,080 A * | 2/2000 | Hodsden .............. B28D 5/0082 |
| | | 125/16.02 |
| 6,065,462 A * | 5/2000 | Hodsden .............. B23D 61/185 |
| | | 125/21 |
| 6,119,325 A * | 9/2000 | Black ...................... H01L 24/81 |
| | | 257/E21.511 |
| 6,419,779 B1 * | 7/2002 | DePetrillo .......... H05K 13/0486 |
| | | 156/254 |

(Continued)

OTHER PUBLICATIONS

K. Nazuka; "Underfill Agent for BGA/CSP Mounting", *Three Bond Technical News*. (2000) http://threebond-europe.com/wp-content/uploads/technical-news-pdf/tech55.pdf.

(Continued)

*Primary Examiner* — Peter Dungba Vo
*Assistant Examiner* — Kaying Kue
(74) *Attorney, Agent, or Firm* — Gerhard W. Thielman, Esq.

(57) ABSTRACT

An assembly is provided for mechanically severing ball grid array (BGA) attachment solder between an electronics chip and a printed circuit board. The assembly includes a bridge fixture, a tungsten wire and removable spacers. The bridge fixture extends over the chip. A pair of guide bars flanks the bridge fixture. each guide bar has a wire engagement surface. The tungsten wire is disposed across the chip between the pair of guide bars along their respective surfaces. The removable spacers are disposed between the corresponding guide bars and the printed circuit board for aligning the wire to engage the solder.

6 Claims, 6 Drawing Sheets

(56) References Cited

U.S. PATENT DOCUMENTS

| | | | | |
|---|---|---|---|---|
| 6,546,803 | B1* | 4/2003 | Ptchelintsev | B06B 1/0622 |
| | | | | 73/625 |
| 6,719,188 | B2* | 4/2004 | Farooq | B23K 1/018 |
| | | | | 228/13 |
| 6,757,948 | B2* | 7/2004 | Ptchelintsev | B06B 1/0622 |
| | | | | 29/25.35 |
| 7,594,328 | B2* | 9/2009 | Pugliese, Jr. | B41J 2/1433 |
| | | | | 29/611 |
| 7,776,651 | B2 | 8/2010 | Hua | 438/109 |
| 7,828,926 | B1* | 11/2010 | Gaysinskiy | B26D 7/1827 |
| | | | | 15/104.002 |
| 2001/0042299 | A1* | 11/2001 | Chikuba | B22F 5/003 |
| | | | | 29/557 |
| 2003/0019918 | A1* | 1/2003 | Farooq | B23K 1/018 |
| | | | | 228/264 |
| 2009/0230566 | A1 | 9/2009 | Hisada et al. | 257/778 |
| 2012/0178346 | A1* | 7/2012 | Wiesner | B28D 5/0076 |
| | | | | 451/54 |
| 2014/0007513 | A1* | 1/2014 | Rehrig | B24B 27/0633 |
| | | | | 51/298 |
| 2014/0141330 | A1* | 5/2014 | Cheng | B28D 5/045 |
| | | | | 429/218.1 |
| 2018/0206371 | A1* | 7/2018 | Williams | H05K 13/0491 |

OTHER PUBLICATIONS

Michael Yu et al.: "Underfill revisited", NexLogic (2011). http://www.embedded.com/print/4235387.

* cited by examiner

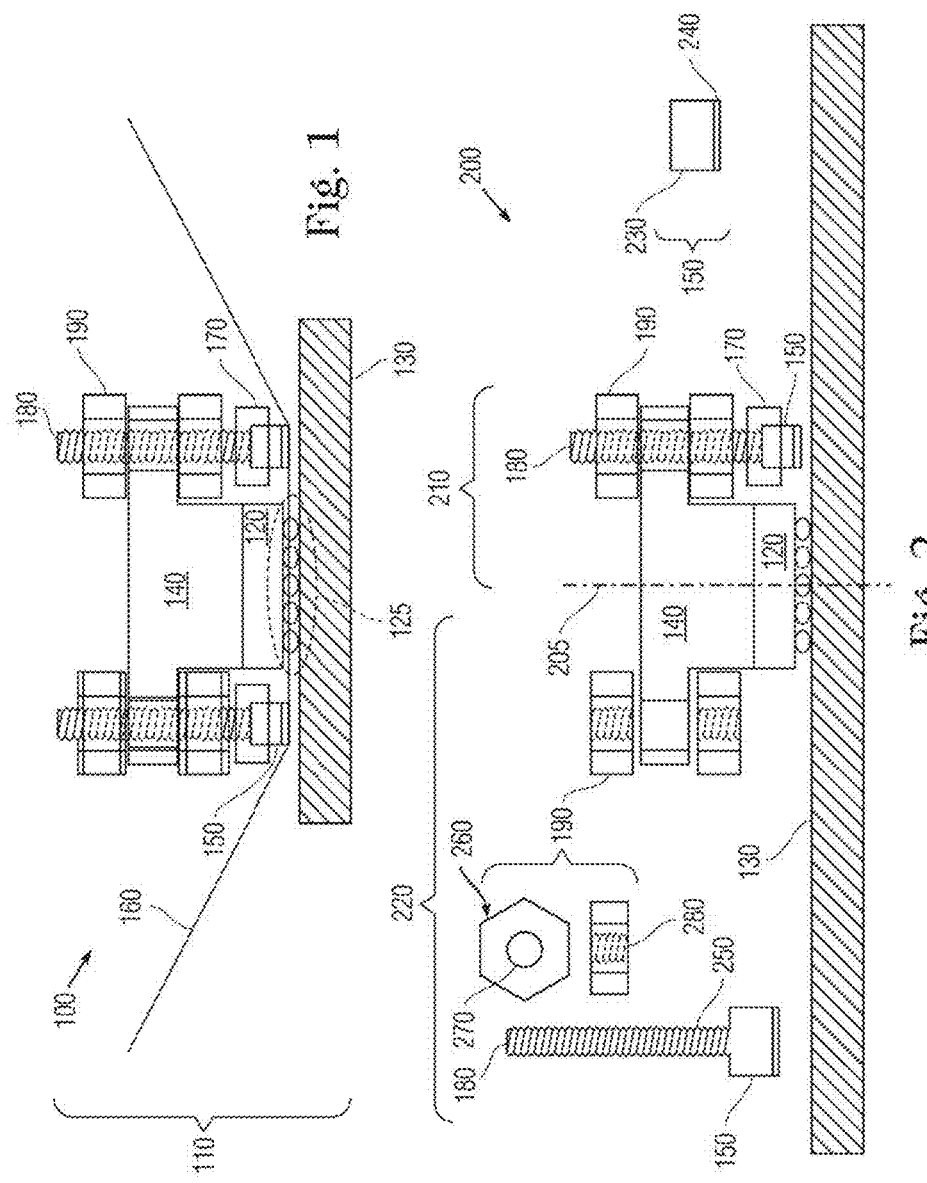

WIRESAW REMOVAL OF MICROELECTRONICS FROM PRINTED CIRCUIT BOARD

STATEMENT OF GOVERNMENT INTEREST

The invention described was made in the performance of official duties by one or more employees of the Department of the Navy, and thus, the invention herein may be manufactured, used or licensed by or for the Government of the United States of America for governmental purposes without the payment of any royalties thereon or therefor.

BACKGROUND

The invention relates generally to non-destructive removal of an integrated circuit chip from a printed circuit board. In particular, the invention relates to a fixture enabling the mechanical severing of the ball grid array that attaches an integrated chip to a printed circuit board.

High-density microelectronics incorporate various package types, of which ball grid array (BGA) integrated circuit chip packaging is the most widely employed for attaching a high I/O pin-count integrated circuit chip to a printed circuit board (PCB). In harsh environments and when reliability is critical, under-fill (epoxy filler) is incorporated between the BGA and the PCB to mitigate thermal expansion mismatching of the various materials, as well as to provide corrosion resistance. In the presence of underfill, removing the BGA from the PCB cannot be performed reliably without serious damage of at least one of these components.

After assembly, a need for the BGA package to be safely removed or replaced on the printed circuit board may exist for many reasons but mostly often for failure analysis reasons. Currently, there are no documented methods for preserving both the circuit board and the BGA package without a high likelihood of damaging one or both of the items. The only documented methods involve mechanically shearing the BGA while applying heat. Either of which can produce damage or mask the failure mechanism.

SUMMARY

Conventional chip removal techniques yield disadvantages addressed by various exemplary embodiments of the present invention. In particular, exemplary embodiments provide a method for mechanically severing through the solder balls of a ball grid array (BGA) located between an BGA chip package and a printed circuit board. The assembly includes a bridge fixture mounted on the back of the chip; a pair of overhanging diamond coated guide bars that flank the bridge fixture, a tungsten wire tensioned around the chip between the pair of guide bars along the coated surfaces; and a pair of temporary removable spacers used to precisely offset the guidebar surfaces from the printed circuit board face. This offset distance corresponds to approximately half the distance between the PCB and BGA (i.e., the solder ball thickness) and with properly applied tension, enables the wiresaw blade to engage the solder exclusively without damaging the PCB or BGA surfaces. Each guide bar has a wire engagement surface (diamond coating).

BRIEF DESCRIPTION OF THE DRAWINGS

These and various other features and aspects of various exemplary embodiments will be readily understood with reference to the following detailed description taken in conjunction with the accompanying drawings, in which like or similar numbers are used throughout, and in which:

FIG. 1 is an elevation view of a removal assembly for cutting a ball grid array;

FIG. 2 is set of assembly and exploded elevation views of exemplary components for the removal assembly;

DETAILED DESCRIPTION

Figure 3:
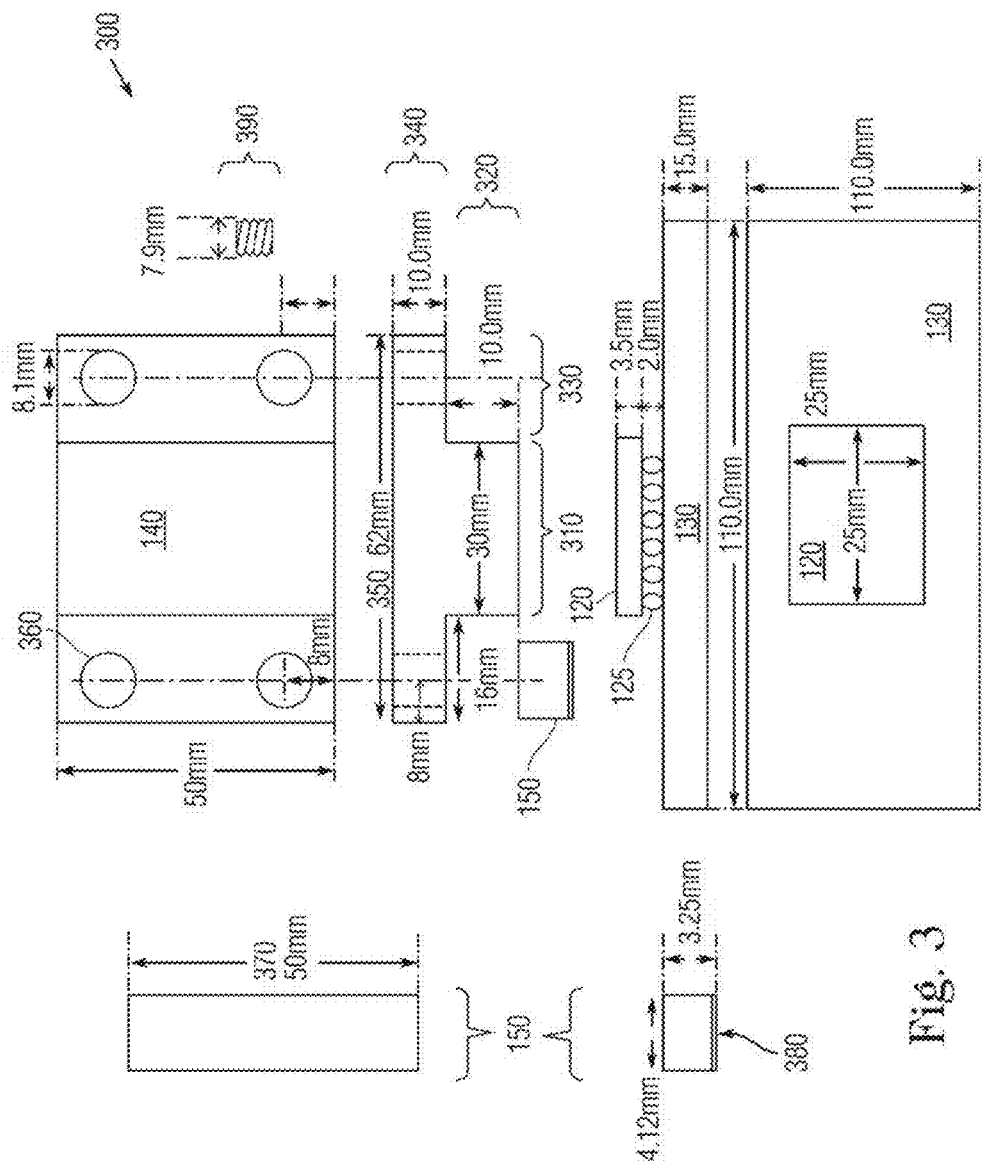
FIG. 3 is a set of plan and elevation exploded views of the removal assembly components.

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized, and logical, mechanical, and other changes may be made without departing from the spirit or scope of the present invention. The following detailed description is, therefore, not to be taken in a limiting sense, and the scope of the present invention is defined only by the appended claims.

Exemplary embodiments provide a technique for mechanical removal of under-filled ball grid array (BGA) packaged microelectronics from a printed circuit board (PCB) using a unique fixture design approach that incorporates a wire-saw. The objective is to develop a technique for removing a BGA chip from its PCB without damaging either the PCB or the BGA.

There are many applications for which such an exemplary technique can be critical. The primary beneficiaries include failure analysis investigations and root cause analysis. However, many conditions arise (especially in prototype designs) where loss of communication occurs between the PCB and the BGA chip such that data stored on the chip become unrecoverable. Non-destructive recovery of both components alleviates this circumstance.

The WS-22 is designed to hold two diamond coated guide bars approximately three inches apart on either side of the sample to keep the wire inline. This operates adequately for an arbitrary sample while preventing the wire from drifting off plane. For exemplary applications, maintaining the wire on plane presented difficulties, but the real challenge was in aligning the 20 μm wire cut plane with the 100 μm BGA gap. The disclosed separating configuration provides an exemplary fixture to locally guide the wire while traveling across the face of the cut surface.

Conventional separation techniques cannot reliably preserve both the BGA and the PCB in a repeatable fashion when under-fill is used. There is a very risky way to accomplish this which involves high temperature and pressure to soften the under-fill and solder while ripping the BGA off the PCB mechanically. However, this technique has a low rate of success and risks damaging both the chip and the board. Worse yet, this method can alter the failure mechanism and obscure the true cause of failure for analysis purposes.

FIG. 1 shows an elevation view 100 of an exemplary removal assembly 110 for cutting an integrated circuit chip 120 mounted by a ball grid array (BGA) of solder balls 125 from a printed circuit board (PCB) 130. The assembly 110 includes a bridge fixture 140 that aligns an opposing pair of adjacent guide bars 150 to provide and maintain a precise cutting plane for the cutting wire 160. A corresponding pair of flanges 170 holds the guide bars 150 on opposite sides of the bridge fixture 140.

Threaded bolts 180 attach to the flanges 170. Hexagonal threaded nuts 190 secure bolts 180 to the bridge fixture 140 in position to hold the flanges 170. An epoxy (not shown) fills the space between the solder balls 125 as well as between the BGA chip 120 (on its bottom side) and the PCB 130. Another epoxy layer (not shown) preferably attaches the BGA chip 120 (on its top side) to the bridge fixture 140.

FIG. 2 shows assembly and exploded elevation views 200 of components for the removal assembly 110. A bilateral centerline 205 divides the assembly view 210 from an exploded view 220 that shows the nuts 190 separated from the fixture 140 and omits the guide bar 150, bolt 180 and flange 170. Each guide bar 150 includes a structural member 230 and a wire-holding surface 240. The bolt 180 includes external threads 250. The nut 190 includes six faces 260 to facilitate tool grip and a threaded orifice 270 that includes internal threads 280 that engage corresponding bolt threads 250.

FIG. 3 shows set of plan and elevation views 300 of components for the removal assembly 110. The fixture 140 includes a base 310 having a ridge 320 that extends laterally by 50 mm with a thickness of 10 mm. A pair of tangs 330 extends laterally by 16 mm each to flank the base 310. The tangs 330 have a thickness 340 of 10 mm extending laterally in length 350 of 62 mm and include four through-holes 360 adjacent the corners, with centerlines 8 mm from the edges.

The BGA chip 120 for this example is square having a length of 25 mm on each side disposed on a PCB 130 that is square having a length of 110 mm. The BGA chip 120 has a thickness of 3.5 mm, while the solder balls 125 have a thickness between 0.1 mm and 0.45 mm. The guide bar 150 has a length 370 of 50 mm across which the cutting wire 160 traverses along an abrasive resistant layer 380 (e.g., diamond coating) to reduce friction, a width of 4.12 mm and a thickness of 3.25 mm. The bolt 180 has a threaded diameter 390 of 7.9 mm to insert into the holes 360 that are 8.1 mm in diameter. Artisans of ordinary skill will recognize that these dimensions are exemplary and not limiting.

The wire-saw model selected was a Princeton Scientific Corp WS-22. The saw design enables a spool of smooth tungsten wire 160 to both oscillate back and forth across the cutting surface and ratchet new wire material through the object being cut. For the exemplary objective, the items to be severed are the solder balls 125 in the array. Princeton Scientific provides the tungsten wire spools comes in 20 μm to 60 μm diameters in 10 μm increments.

Figure 4:
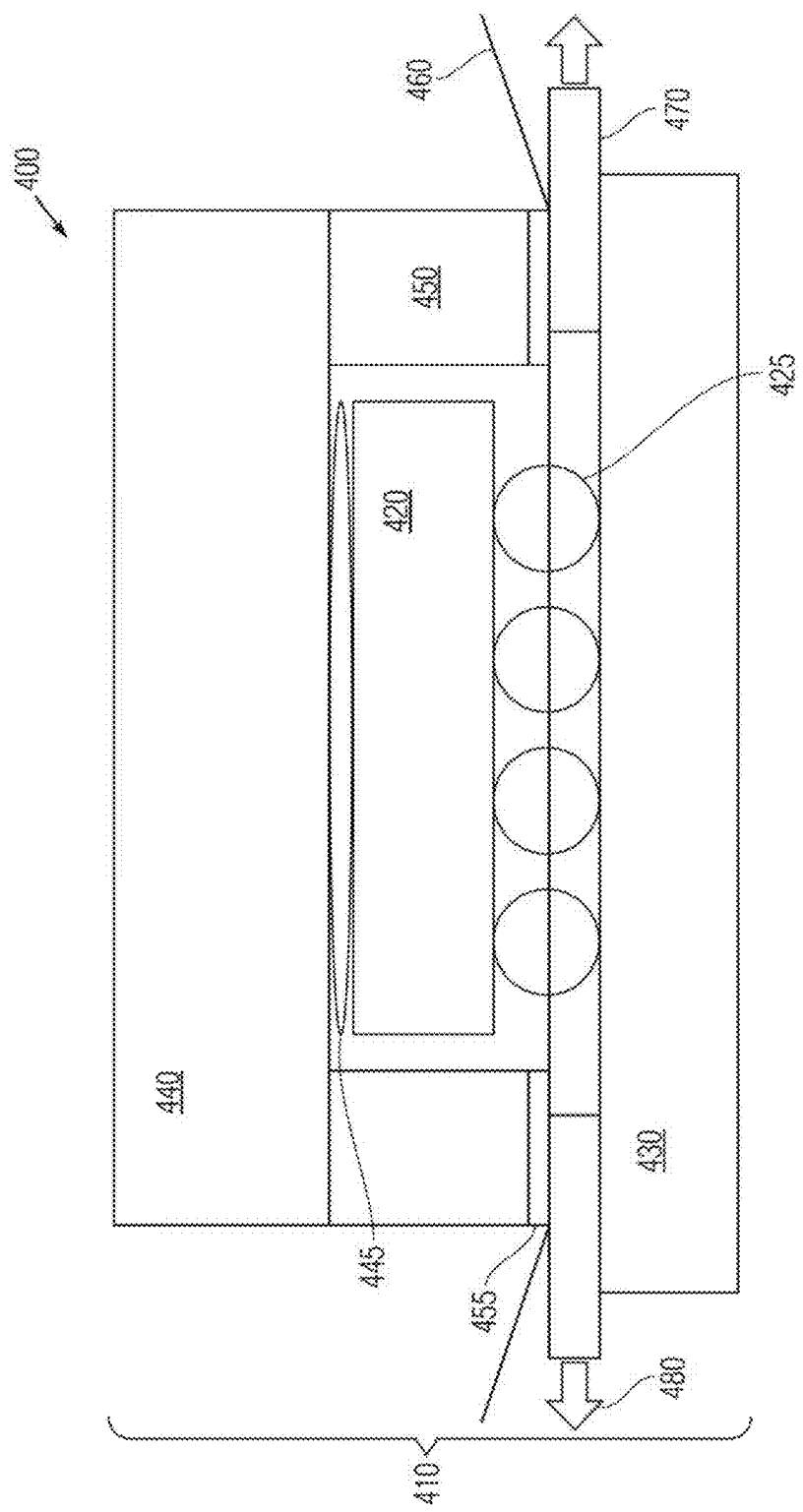
FIG. 4 is an elevation view of an alternative removal assembly for cutting the ball grid array.

FIG. 4 shows an elevation assembly view 400 of an alternate configuration (based on an earlier fixture design) for a removal assembly 410 for severing a ball grid array (BGA) chip 420 attached by metal contact solder balls 425 to a printed circuit board (PCB) 430. The assembly 410 includes a mount fixture 440. An epoxy 445 fills the space between the BGA chip 420 and the fixture 440, which aligns an adjacent pair of guide bars 450, each having a wire holding portion 455 to maintain a precision cutting plane for a cutting wire 460. A pair of temporary spacers 470 separates the PCB 430 from the guide bar 450. After the epoxy 445 has cured, the spacers 470 can be removed in directions 480. The temporarily positioned spacers 470 align the guide bars 450 and provide a precision offset from the PCB 430.

The smooth tungsten wire 160 (or 460) can deliver abrasive slurry to the cutting surface via an automated drip line from a reservoir located above the sample chip 420. The exemplary tool is designed for cutting through hard materials such as primarily for x-ray diffraction. The WS-22 is designed to hold two diamond coated guide bars 150 (or 450) approximately 3" (three inches) apart on either side of the sample to keep the wire 160 inline. This technique functions adequately for an arbitrary sample in which the objective is to simply prevent the wire 160 from drifting off plane.

For exemplary embodiments, maintaining the wire 460 on plane was a challenge, but the real challenge constituted aligning the 20 μm wire cut plane with the 100 μm to 450 μm gap for the BGA chip 420. To address this, temporary steel spacers 470 were machined to be disposed on the surface of the PCB 430 on either side of the BGA chip 420. The spacers 470 can be precision machined on an Allied Multiprep polishing system. The diameter of wire 460 and the thickness of the spacers 470 depend on the gap of the BGA chip 420 being cut. Thicker wire 460 enables higher tension during the cutting process, while requiring tighter tolerances for the spacers 470.

For instance, for a gap for the BGA chip 120 of 150 μm (diameter of solder ball post reflow), a 30 μm wire was chosen enabling 120 μm of tolerance for cutting. The spacers 470 were machined to approximately 90 μm. These spacers 470 are temporarily placed on the board, while the diamond coated guide bars 450 are mounted on either side of the BGA chip 120.

These two guide bars 450 are then affixed to a custom fixture 440 of machined steel or aluminum to act as a bridge (piggy backing) the BGA chip 420. While the temporary spacers 470 are in position, the guide bars 450 are then disposed on top of the spacers 470 and the bridge fixture 440 both glued to both the reverse face of the BGA chip 420 as well as the top of the spacers 470 with epoxy 445.

Upon curing, the spacers 470 are removed and the guide bars 450 then float precisely 90 μm above the upper surface of the PCB 430. The sample BGA 420 then mounts to the saw assembly 410, and the wire 460 feeds through the guide bars 450 so that cutting of the solder balls 425 can begin. As long as the sample BGA 420 is held so the wire 460 deflects by the diamond face of the guide bars 450, the wire 460 and abrasive maintain a cutting position consistent with plane of the guide bars 450.

Conceptually, this exemplary fixture 440 has to avoid impeding the path of the wire 460 while traveling between the PCB 430 and the BGA chip 420 (i.e., cuts through middle of array of solder balls 425). For this to occur, the fixture 440 mounts on the reverse of the BGA chip 420 (piggy back) and the guide bar 450 hangs down toward the PCB 430 on either side of the BGA 420. The guide bars 450 are precisely spaced so the face of the guide bar 450 aligns (in plane) with the midpoint of the solder balls 425. To achieve this precision, spacers 470 can be milled for the variety of BGA geometries.

There are many microelectronics failure analysis engineers who are interested in this capability, including this community and possibly Princeton Scientific. The exemplary technique is a very useful for failure analysis to isolate the chip 420 from the PCB 430 to determine root cause.

Figure 5:
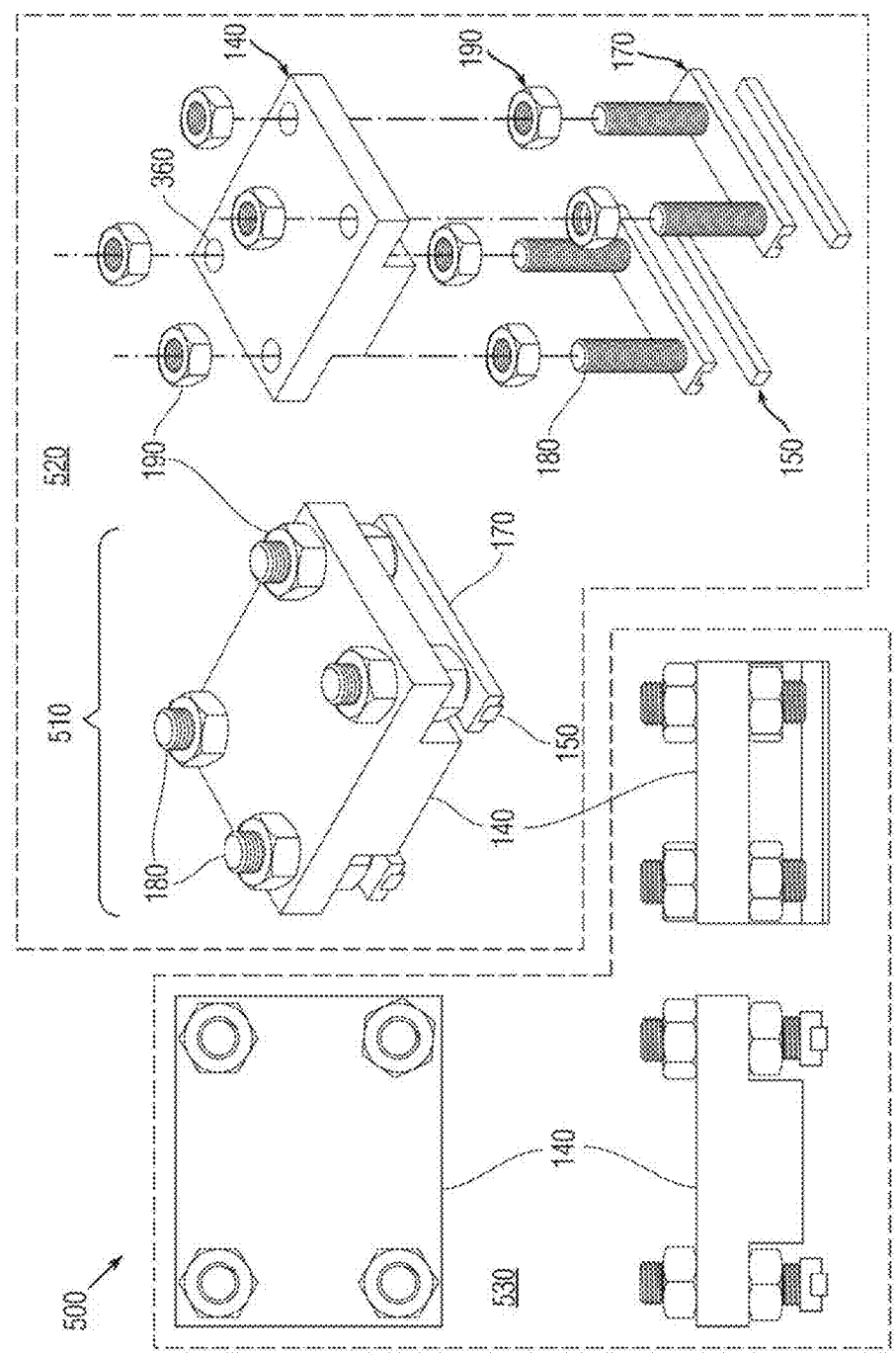
FIG. 5 is a set of assembly and exploded views of the fixture.

FIG. 5 shows further assembly and exploded views 500 of a fixture assembly 510 associated with the exemplary removal assembly 110. Region 520 shows isometric assembly and exploded views of the fixture 140 and related components, including alignment lines for the nuts 190, the bolts 180 and the through-holes 360 of the tangs 330 that hold the flanges 170 that secure the guide bars 150. Region 530 shows plan and elevation assembly views of the fixture assembly 510. The fixture 140 is preferably composed of a metal such as aluminum or steel and typically cast or machined to the appropriate dimensions. The guide bars 150 and the flanges 170 are similarly composed of a metal.

Figure 6:
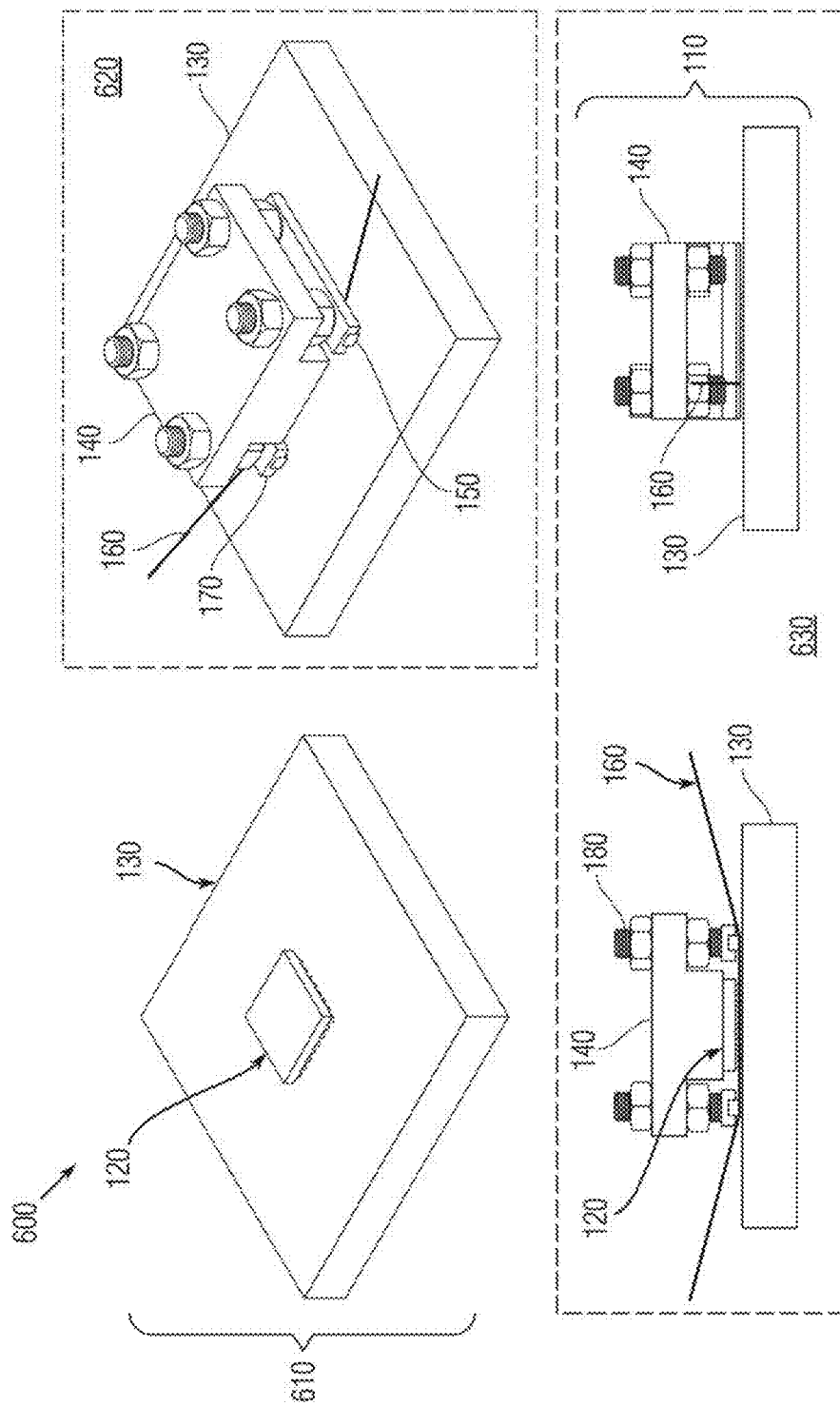
FIG. 6 is a set of isometric and elevation views of the removal assembly.

FIG. 6 shows additional isometric and elevation views 600 of exemplary assemblies. The chip assembly 610 is shown in isometric view including the BGA chip 120 mounted to the PCB 130. Components for the exemplary removal assembly 110 operationally combine the fixture assembly 510 with chip assembly 610.

Region 620 shows an isometric view of the removal assembly 110 on the PCB 130 with the cutting wire 160 aligned to cut the solder balls 125 and thereby separate the BGA chip 120 from the PCB 130. Region 630 shows front and side elevation views of the removal assembly 110. The cutting wire 160 is disposed between the guide bars 150 to align against the solder balls 125.

Figure 7:
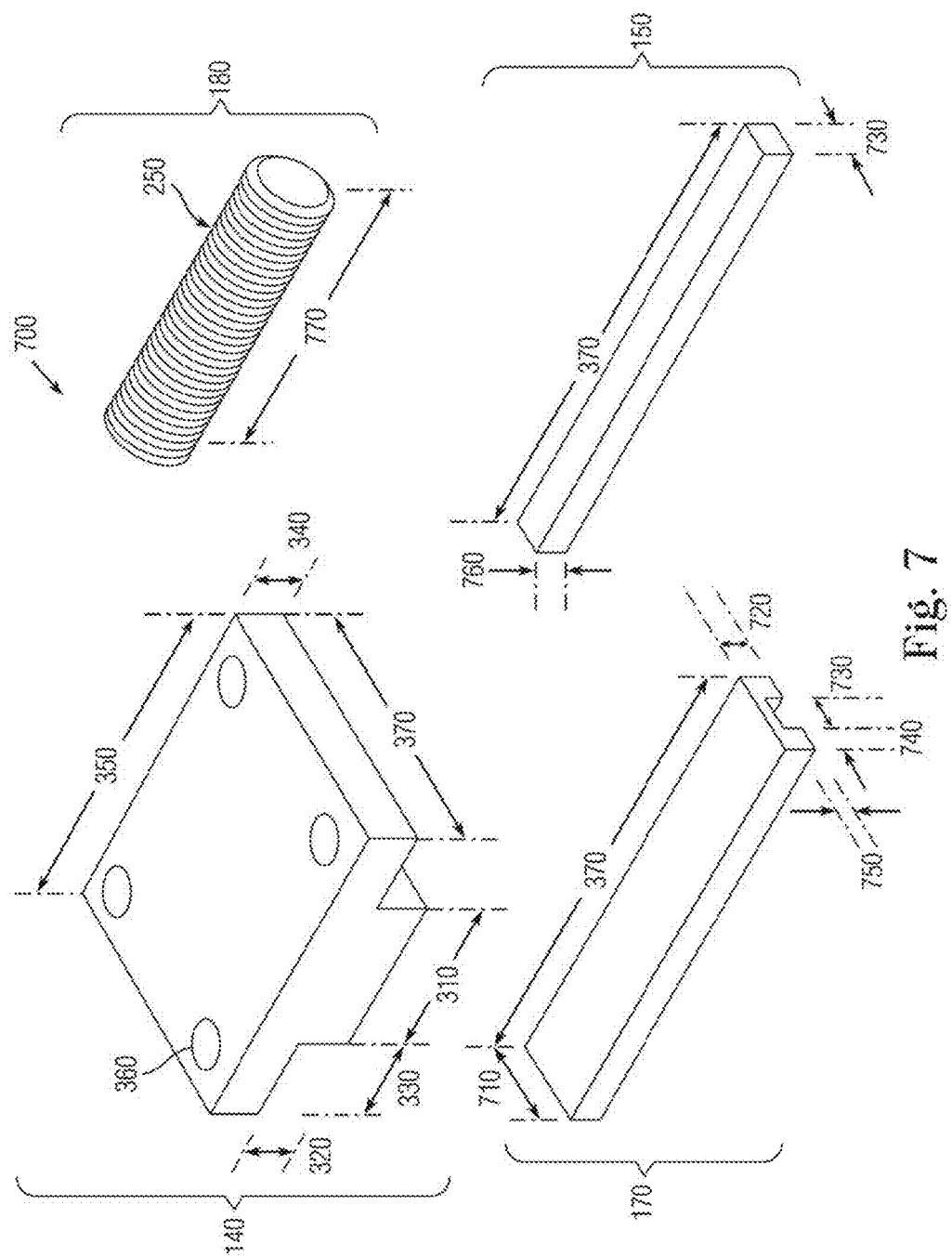
FIG. 7 is a set of isometric views of the fixture components.

FIG. 7 shows additional isometric views 700 of components associated with the exemplary removal assembly 110. The fixture bridge 140 includes example dimensions. The length 310, width 370 and thickness 320 of the base whose bottom surface interfaces the BGA chip 120 are respectively 30 mm, 50 mm and 10 mm. The length 330 and thickness 340 of the tang are respectively 16 mm and 10 mm. The total length 370 of the fixture bridge 140 (including the base and tangs) is 62 mm. The fixture bridge 140 can be composed of metal, such as steel or aluminum.

The guide bar 150, the flange 170 and the bolt 180 also include example dimensions, and can be composed of metal, such as steel or aluminum. The flange 170 has length 370, width 710 and thickness 720 respectively of 50 mm, 10 mm and 4.0 mm. The bottom of the flange 170 has a center channel with a width 730 of 4.12 mm flanked by widths 740 of 2.94 mm each. The center channel also has a depth 750 of 2.0 mm. The guide bar 150 has a length 370, width 730 and thickness 760 respectively of 50 mm and 4.12 mm and 3.25 mm (and thus extends below the flange 170). The bolt 180 has a length 770 of 30 mm and a thread 390 of M8 with a diameter of 7.9 mm.

While certain features of the embodiments of the invention have been illustrated as described herein, many modifications, substitutions, changes and equivalents will now occur to those skilled in the art. It is, therefore, to be understood that the appended claims are intended to cover all such modifications and changes as fall within the true spirit of the embodiments.

What is claimed is:

1. An assembly for mechanically severing ball grid array (BGA) attachment solder between an electronics chip and a printed circuit board, said assembly comprising:
    a bridge fixture extending over the chip;
    a pair of guide bars that flank said bridge fixture, each guide bar having a wire engagement surface and attaching to said bridge fixture by a threaded nut-and-bolt pair; and
    a tungsten wire suspended between said pair of guide bars along their respective surfaces, said wire oscillating back and forth across the solder.

2. The assembly according to claim 1, wherein said tungsten wire receives an abrasive slurry for severing the solder.

3. The fixture according to claim 2, wherein said wire engagement surfaces are diamond coated.

4. An assembly for mechanically severing ball grid array (BGA) attachment solder between an electronics chip and a printed circuit board, said assembly comprising:
    a bridge fixture extending over the chip;
    a pair of guide bars that flank said bridge fixture, each guide bar having a wire engagement surface; and
    a tungsten wire suspended between said pair of guide bars along their respective surfaces, said wire oscillating back and forth across the solder, wherein a pair of removable spacers is disposed between said corresponding guide bars and the printed circuit board for aligning said wire to engage the solder.

5. The assembly according to claim 4, further including a pair of flanges to secure respective said spacers to said bridge fixture.

6. The assembly according to claim 5, wherein said bridge fixture includes tangs extending outward from the chip, each tang having holes for receiving threaded bolts, each bolt secured to said tang by threaded nuts.

\* \* \* \* \*